US011328580B2

(12) United States Patent
Vannebo

(10) Patent No.: US 11,328,580 B2
(45) Date of Patent: May 10, 2022

(54) TESTING OF A NETWORK OF HAZARD WARNING DEVICES

(71) Applicant: Autronica Fire & Security AS, Trondheim (NO)

(72) Inventor: Per Johan Vannebo, Trondheim (NO)

(73) Assignee: AUTRONICA FIRE & SECURITY AS, Trondheim (NO)

( * ) Notice: Subject to any disclaimer, the term of this patent is extended or adjusted under 35 U.S.C. 154(b) by 0 days.

(21) Appl. No.: 17/056,526

(22) PCT Filed: May 29, 2018

(86) PCT No.: PCT/EP2018/064115
§ 371 (c)(1),
(2) Date: Nov. 18, 2020

(87) PCT Pub. No.: WO2019/228617
PCT Pub. Date: Dec. 5, 2019

(65) Prior Publication Data
US 2021/0209933 A1     Jul. 8, 2021

(51) Int. Cl.
*G08B 29/12*     (2006.01)
*G01R 19/165*    (2006.01)
*G08B 21/18*     (2006.01)

(52) U.S. Cl.
CPC ....... *G08B 29/12* (2013.01); *G01R 19/16576* (2013.01); *G08B 21/182* (2013.01); *G08B 29/123* (2013.01)

(58) Field of Classification Search
CPC .... G08B 29/12; G08B 21/182; G08B 29/123; G01R 19/16576

USPC ........................................................ 340/514
See application file for complete search history.

(56) References Cited

U.S. PATENT DOCUMENTS

| 4,253,091 A | 2/1981 | Frydman |
| 4,742,334 A | 5/1988 | Teich et al. |
| 5,138,562 A | 8/1992 | Shaw et al. |
| 5,402,101 A | 3/1995 | Berger et al. |
| 6,583,628 B2 | 6/2003 | Ropke |
| 6,756,906 B2 | 6/2004 | Bernal et al. |
| 7,498,934 B2 | 3/2009 | Tusel |
| 7,609,154 B2 | 10/2009 | Bennett |
| 7,982,597 B2 | 7/2011 | Koida |

(Continued)

FOREIGN PATENT DOCUMENTS

| DE | 102010047227 B3 | 3/2012 |
| EP | 2169645 B1 | 5/2011 |

(Continued)

OTHER PUBLICATIONS

ISR/WO for Application No. PCT/EP2018/064115; dated Feb. 18, 2019; 12 pages.

*Primary Examiner* — John A Tweel, Jr.
(74) *Attorney, Agent, or Firm* — Cantor Colburn LLP

(57) ABSTRACT

Disclosed is an alarm unit electrically connected to a loop circuit in a networked alarm system, the loop circuit being electrically connected to a first power source and a first controller, the alarm unit including: a current sink, a second controller for controlling the current sink, wherein the second controller performs an alarm unit status test including: receiving instructions from the first controller to actuate the current sink, and actuating the current sink.

16 Claims, 5 Drawing Sheets

(56) References Cited

U.S. PATENT DOCUMENTS

| | | | |
|---|---|---|---|
| 8,299,911 B2 | 10/2012 | Buss | |
| 8,760,280 B2 * | 6/2014 | Piccolo, III | G08B 17/00 340/506 |
| 9,564,045 B2 | 2/2017 | Ainsworth et al. | |
| 9,633,554 B1 | 4/2017 | Barson | |
| 10,282,975 B2 * | 5/2019 | King | G01N 33/007 |
| 2016/0140836 A1 | 5/2016 | Stamer | |

FOREIGN PATENT DOCUMENTS

| | | |
|---|---|---|
| EP | 2232455 B1 | 4/2013 |
| EP | 2093737 B1 | 10/2013 |
| EP | 2706518 A1 | 3/2014 |
| EP | 2437228 B1 | 8/2016 |
| WO | 17089185 A1 | 1/2017 |

\* cited by examiner

TESTING OF A NETWORK OF HAZARD WARNING DEVICES

CROSS REFERENCE TO RELATED APPLICATIONS

This is a US National Stage of Application No. PCT/EP2018/064115, filed on May 29, 2018, the disclosure of which is incorporated herein by reference.

BACKGROUND

Exemplary embodiments pertain to the art of hazard warning devices and more specifically to testing of a network of hazard warning devices.

In an industrial hazard warning system, detectors/sounders etc. may be placed in a loop. The span of the loop may be 2-4 km long. To power such a system, limited energy may be available, and voltage drops may be a concern. Loop units may use less energy in a normal operation than during a maximum alarm state. It may be difficult to estimate a worst case current consumption, such as which may occur with a loop break, without actual field testing of the loop units. A situation may occur where the detection loop meets all requirements during steady state usage, but fails under maximum loading.

A full loop unit activation test may ensure that a loop works under maximum load. Such a procedure, however, may be cumbersome, as it may require an activation of all sounders, input/output devices, flash beacons, etc., at the same time.

BRIEF DESCRIPTION

Disclosed is an alarm unit electrically connected to a loop circuit in a networked alarm system, the loop circuit being electrically connected to a first power source and a first controller, the alarm unit comprising: a current sink, a second controller for controlling the current sink, wherein the second controller performs an alarm unit status test including: receiving instructions from the first controller to actuate the current sink, and actuating the current sink.

In addition to one or more of the above disclosed features or as an alternate the system status test includes the second controller measuring the voltage across the current sink, and sending the measured voltage to the circuit controller.

In addition to one or more of the above disclosed features or as an alternate the alarm unit is electrically connected to a second power source.

In addition to one or more of the above disclosed features or as an alternate the alarm unit is one or more of a smoke detector, a heat detector, a pull station, a beacon, a sounder, a flame detector, an Input/Output unit, a gas sensor, a wireless gateway, an explosion barrier, a combined smoke/heat detector, and a combined smoke/heat/carbon monoxide detector.

Further disclosed is a network alarm system comprising: a loop circuit, a first power source and a first controller electrically connected to the loop circuit, the first controller controlling the first power source, a plurality of the alarm units having one or more of the above disclosed features electrically connected to the first circuit, the plurality of the alarm units comprising a corresponding plurality of current sinks, wherein the first controller performs a system status test including: instructing the plurality of alarm units to actuate the corresponding plurality of current sinks, and determining from at least one measured voltage an operational condition of the system.

In addition to one or more of the above disclosed features or as an alternate the status test includes the first controller receiving from the plurality of alarm units a corresponding plurality of measured voltages, determining from the plurality of measured voltages the operational condition of the system.

In addition to one or more of the above disclosed features or as an alternate determining the operational condition of the system includes determining one or more of: a quality of connections of circuit cable segments, a resistance of the circuit cable segments between the plurality of alarm units, and a span of the circuit cable segments between the plurality of alarm units.

In addition to one or more of the above disclosed features or as an alternate the first controller periodically performs the system status test.

In addition to one or more of the above disclosed features or as an alternate the plurality of alarm units are electrically connected to a second power source.

In addition to one or more of the above disclosed features or as an alternate the first controller disengages the second power source, instructs the plurality of alarm units to actuate the corresponding plurality of current sinks, determines a first voltage on the loop circuit, engages the second power source and disengages the first power source, instructs the plurality of alarm units to actuate the corresponding plurality of current sinks, determines a second voltage on the loop circuit, and compares the first and second voltages to a threshold value to determine the operational condition of the system.

Further disclosed is a method of performing a status test by an alarm unit, the alarm unit having one or more of the above disclosed features. Yet further disclosed is a method of performing a status test by a network alarm system, the network alarm system including one or more of the above disclosed features.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
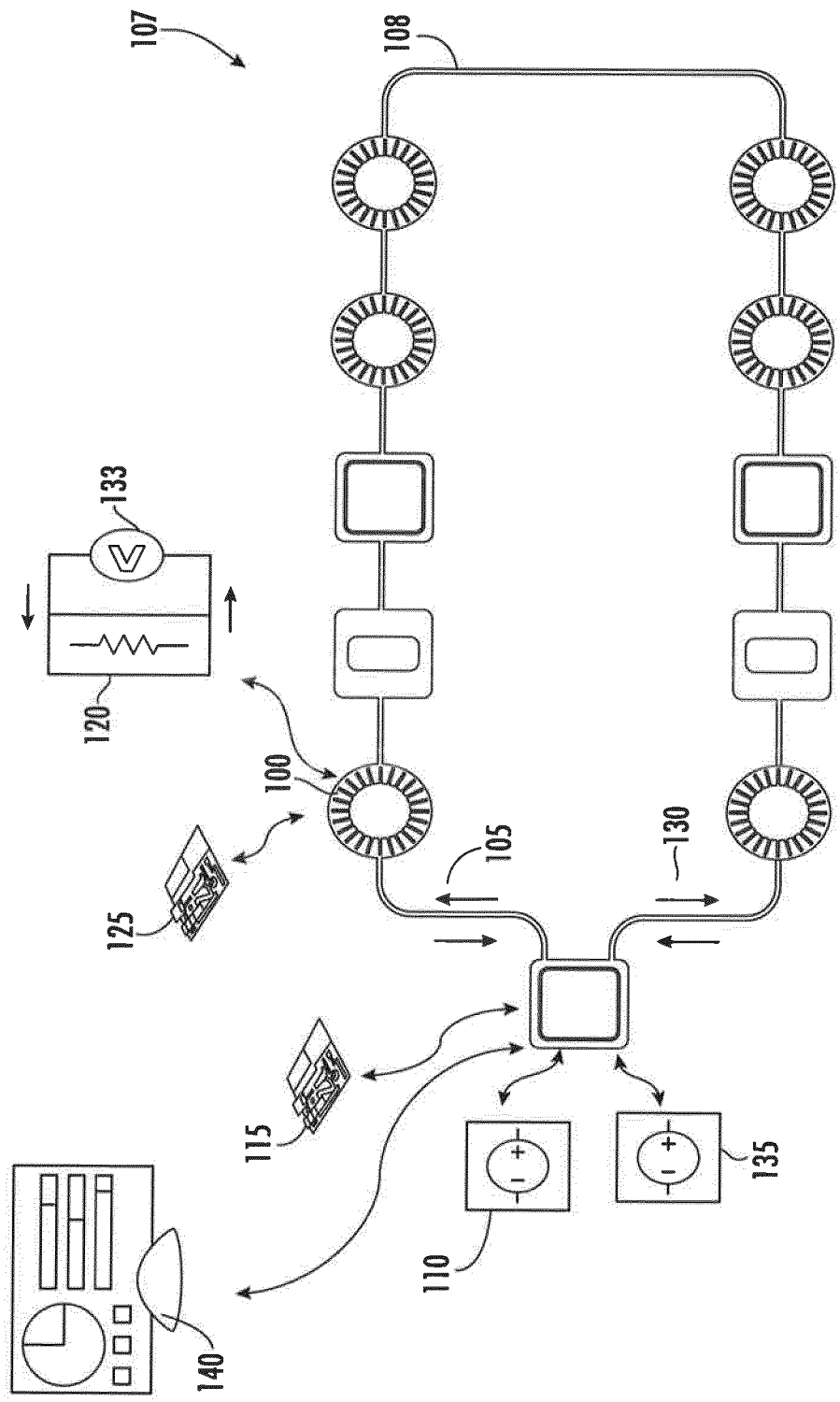
FIG. 1 illustrates a networked alarm system of a disclosed embodiment.

Turning to FIG. 1, disclosed is an alarm unit 100 electrically connected to a networked alarm system 107 which includes a loop circuit 108. The loop circuit 108 may be electrically connected to a first power source 110 that energizes the loop circuit 108 along a first path 105. In addition the loop circuit 108 may include a first controller 115. The alarm unit 100 may comprise a current sink 120 and a second controller 125 for controlling the current sink 120.

Figure 2:
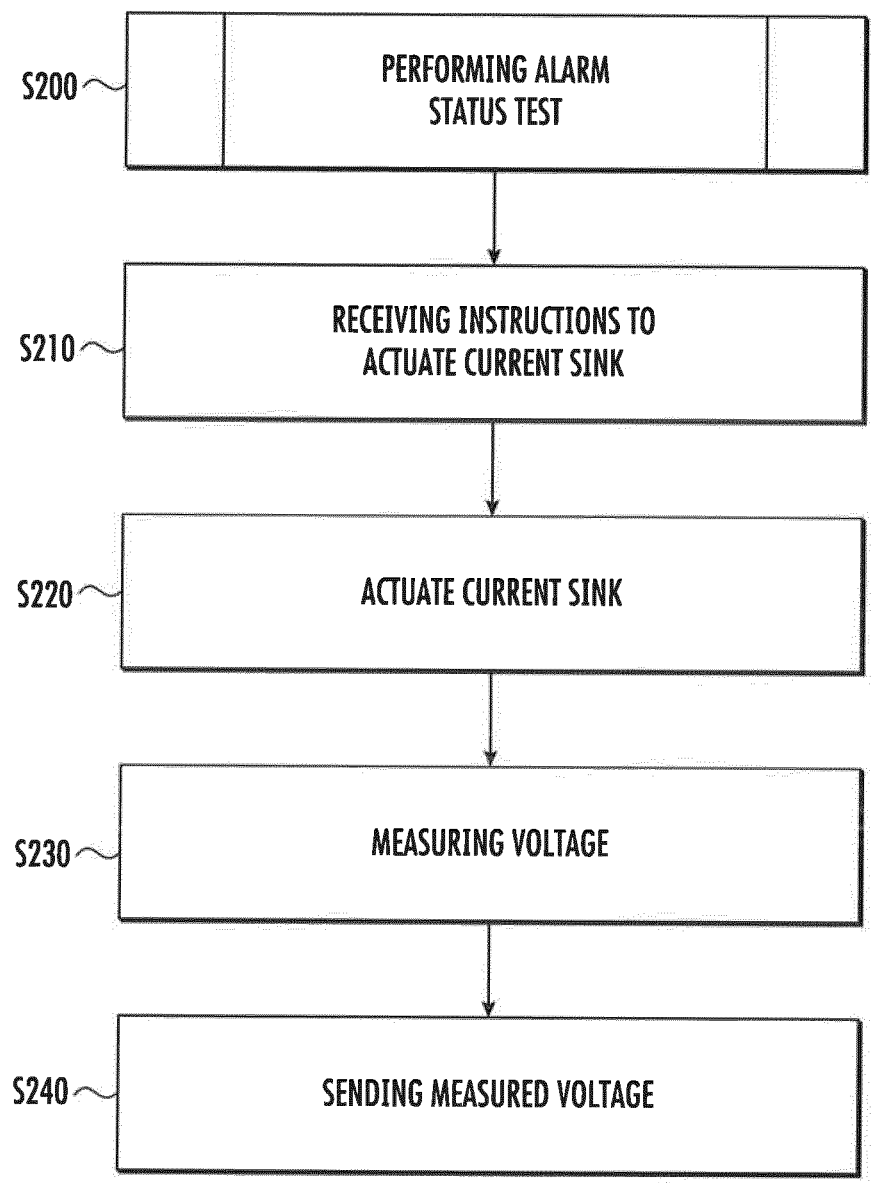
FIG. 2 illustrates a process performed by an alarm unit of a disclosed embodiment.

As illustrated in FIG. 2, the second controller 125 may perform a first step S200 of performing an alarm unit status test. Step S200 may include a first step S210 of receiving instructions from the first controller 115 to actuate the current sink 120. A second step S220 may include the second controller 125 actuating the current sink 120. A third step S230 may include the second controller 125 measuring the voltage across the current sink 120. The voltage measurement may be carried out through an integrated voltmeter 133. A fourth step S240 may include the second controller 125 sending the measured voltage to the circuit controller 115.

Turning back to FIG. 1, additional features of the alarm unit 100 include that the alarm unit 100 may be electrically connected to a second power source 135 that energizes the loop circuit 107 along a second path 130. The first and second power sources 110, 135 may be used together when there is a break or short in the loop circuit 108 that would otherwise leave one or more working loop units without power from the first power source 110. Thus, the second power source 135 may be considered a redundant power source for the loop circuit 108.

The alarm unit 100 may be one or more, or a combination of, various types of detectors. For example, the unit 100 may be a smoke detector, a heat detector, a pull station, a beacon, a sounder, a flame detector, an Input/Output unit, a gas sensor, a wireless gateway, an explosion barrier, a combined smoke/heat detector, and a combined smoke/heat/carbon monoxide detector. These types of hazard warning devices are not intended to be limiting.

In one embodiment the alarm unit 100 includes a light emitting diode (LED), which is actuated as the current sink 120. Other forms of current resisting implements may be integrated into the alarm unit 100 to prevent a short during the test.

With reference now to the system 107, the system 107 may include a plurality of the alarm units electrically connected to the first circuit 105. The plurality of the alarm units may comprise a corresponding plurality of current sinks.

Figure 3A:
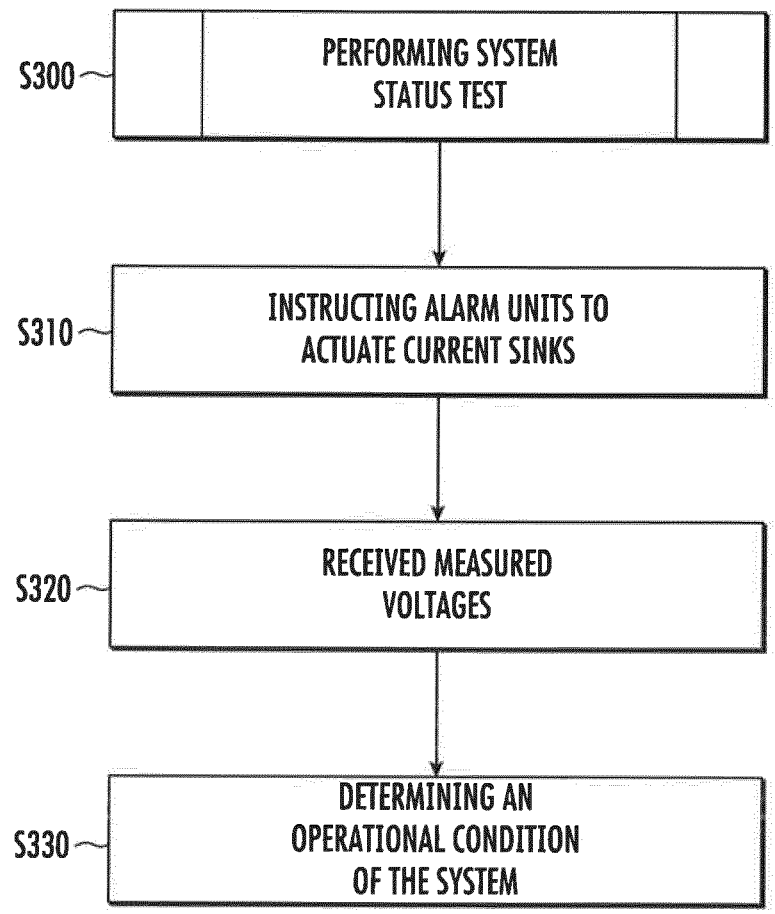
FIGS. 3A-3B illustrate processes performed by a system controller of a disclosed embodiment.

Turning to FIG. 3A, the first controller 115 may execute step S300 of performing a system status test. Step S300 may include a first step S310 of the first controller 115 simultaneously instructing the plurality of alarm units to actuate the corresponding plurality of current sinks. A second step may include step S320 of the first controller 115 receiving from the plurality of alarm units a corresponding plurality of measured voltages. A third step S330 may include the first controller 115 determining from the plurality of measured voltages an operational condition of the system 107. Step S330 may include determining one or more of a quality of connections of circuit cable segments, a resistance of the circuit cable segments between the plurality of alarm units, and a span of the circuit cable segments between the plurality of alarm units. In one embodiment the first controller 115 performs the system status test before commission and periodically to ensure the system is functioning properly or to correct connection or alarm unit problems as problems arise.

Figure 3B:
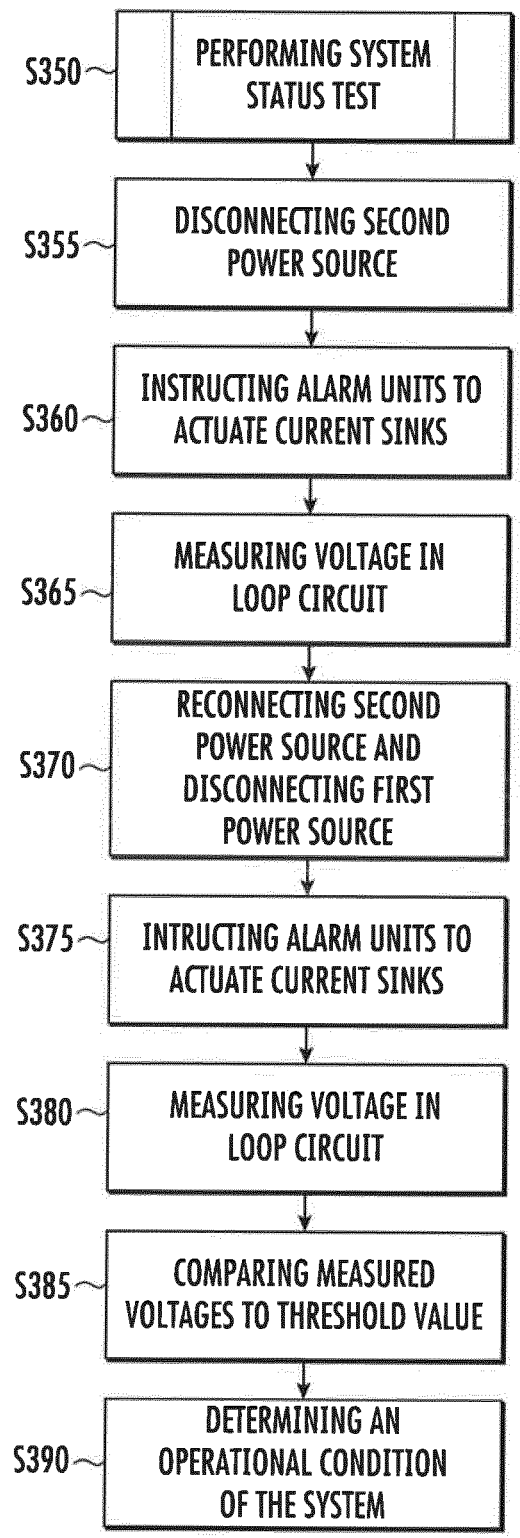

Turning to FIG. 3B, in one embodiment the first controller 115 may execute an alternative step S350 for performing a system status test. Step S350 may include a first step S355 of the first controller 115 disconnecting the second power source 135. With this configuration the second power source 135 does not power the loop circuit 108. Thereafter step S360 may include the first controller 115 instructing the plurality of alarm units to actuate the corresponding plurality of current sinks. At step S365 the first controller 115 may measure voltage across the loop circuit 108.

Then at step S370 the first controller 115 may reconnect the second power source 135 and disconnect the first power source 110. With this configuration the first power source 110 does not power the first circuit 105. Thereafter step S375 may include the first controller 115 instructing the plurality of alarm units to actuate the corresponding plurality of current sinks. At step S380 the first controller 115 may measure voltage across the loop circuit 108. At step S385 the first controller 115 compares the two measured voltages against a threshold value. At step S390, using the comparisons, the first controller 115 determines an operating condition of the system 107. That is, if the measured voltages are within predetermined tolerance, the system 10 is considered sufficiently operational.

The test illustrated in FIG. 3A may have one or more benefits as compared with the test illustrated in FIG. 3B. For example the test illustrated in FIG. 3A, with simultaneous power available to both circuits, enables obtaining more diagnostic information than with the test in FIG. 3B.

Turning back to FIG. 1, additional features of the system 107 will be discussed. In one embodiment the loop circuit 107 provides for communication of power and data over common lines between the alarm units and the first controller 115. Further, the system 107 may include a fire alarm control panel 140 containing one or more of the first controller 115, the first power source 110 and the second power source 135.

The above disclosed embodiments provide a system and method for testing an alarm system to determine whether it may handle a "worst-case state", that is a broken loop—without having to separately test sounders, beacons, etc. The programmable current sink may be provided on every alarm unit (loop unit). The current sink may mimic actual current consumption of the alarm unit under maximum stress. After activating all sinks simultaneously, the loop units may measure actual loop voltage and report to the system controller (fire central).

An analysis of obtained data may be used to map a resistance of cable segments between the loop units, enabling an estimate of cable distances etc. For optical smoke detectors, it may be preferred to use the existing LEDs to sink current without adding circuitry for this feature.

For testing an alarm system, the disclosed embodiments, however, may be used during commissioning and during the life time of an alarm system. The disclosed embodiments may be applied to detect poor cable connections and similar issues during a useful life of an alarm system before such issues become problems. For example, such issues may occur from corrosion, vibration, etc.

Figure 4:
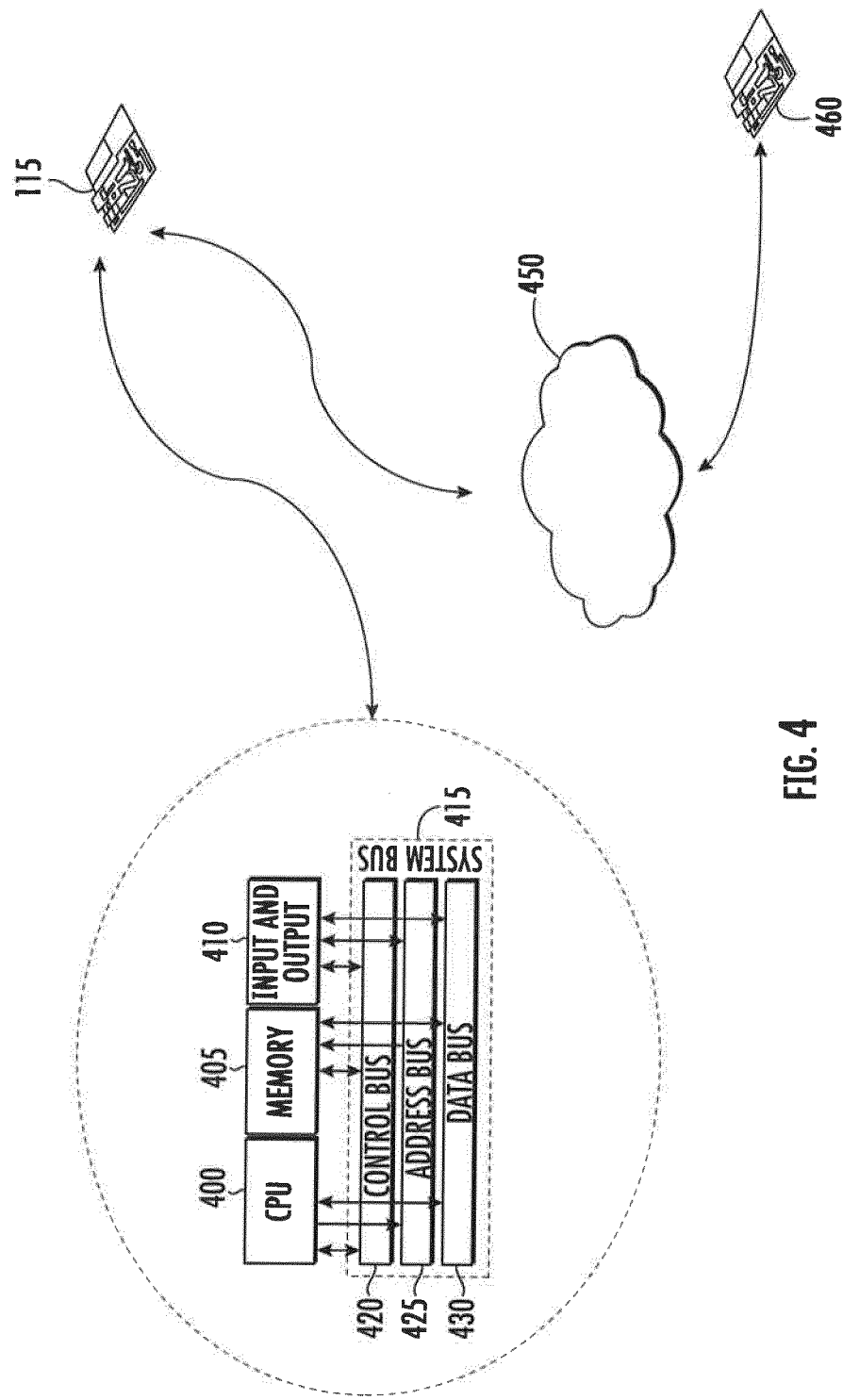
FIG. 4 illustrates telecommunication features of a disclosed embodiment.

Turning now to FIG. 4, additional features of the controllers will be briefly disclosed. As indicated above, the embodiments herein may include the plurality of controllers including the first controller 115 and the second controller 125. The plurality of controllers may have substantially the same technology features. Accordingly, features of the plurality of controllers may be disclosed hereinafter with reference to the first controller 115, which may be generally referred to hereinafter as controller 115.

The controller 115 may be a computing device that includes processing circuitry that may further include an application specific integrated circuit (ASIC), an electronic circuit with one or more elemental circuit components such as resistors, an electronic processor (shared, dedicated, or group) 400 and memory 405 that executes one or more software algorithms or firmware algorithms and programs, contains relevant data which may be dynamically collected or disposed in one or more look-up tables, a combinational logic circuit that contains one or more operational amplifiers, and/or other suitable interfaces and components that provide the described functionality. For example, the processor 400 processes data stored in the memory 405 and employs the data in various control algorithms, diagnostics and the like.

The controller 115 may further include, in addition to a processor 400 and memory 405, one or more input and/or output (I/O) device interface(s) 410 that are communicatively coupled via an onboard (local) interface to communicate among the plurality of controllers. The onboard interface may include, for example but not limited to, an onboard system bus 415, including a control bus 420 (for inter-device communications), an address bus 425 (for physical addressing) and a data bus 430 (for transferring data). That is, the system bus 415 enables the electronic communications between the processor 400, memory 405 and I/O connections 410. The I/O connections 410 may also include wired connections and/or wireless connections. The onboard interface may have additional elements, which are omitted for simplicity, such as controllers, buffers (caches), drivers, repeaters, and receivers to enable electronic communications.

In operation, the processor 400 onboard the controller 115 may be configured to execute software algorithms stored within the memory 405, to communicate data to and from the memory 405, and to generally control computing operations pursuant to the software algorithms. The algorithms in the memory 405, in whole or in part, may be read by the processor 400, perhaps buffered within the processor 400, and then executed. The processor 400 may include hardware devices for executing the algorithms, particularly algorithms stored in memory 405. The processor 400 may be a custom made or a commercially available processor 400, a central processing units (CPU), an auxiliary processor among several processors associated with computing devices, semiconductor based microprocessors (in the form of microchips or chip sets), or generally any such devices for executing software algorithms.

The memory 405 onboard the controller 115 may include any one or combination of volatile memory elements (e.g., random access memory (RAM, such as D M, S M, SDRAM, VRAM, etc.)) and/or nonvolatile memory elements (e.g., ROM, hard drive, tape, CD-ROM, etc.). Moreover, the memory 405 may incorporate electronic, magnetic, optical, and/or other types of storage media. The memory 405 may also have a distributed architecture, where various components are situated remotely from one another, but may be accessed by the processor 400.

The software algorithms in the memory 405 onboard the controller 115 may include one or more separate programs, each of which includes an ordered listing of executable instructions for implementing logical functions. A system component embodied as software algorithms may be construed as a source program, executable program (object code), script, or any other entity comprising a set of instructions to be performed. When constructed as a source program, the software algorithms may be translated via a compiler, assembler, interpreter, or the like, which may or may not be included within the memory.

Some of the input/output (I/O) devices that may be coupled to the controller 115 using the system I/O Interface(s) 410, the wired interfaces and/or the wireless interfaces will now be identified but the illustration of which shall be omitted for brevity. Such I/O devices include, but are not limited to (i) input devices such as a keyboard, mouse, scanner, microphone, camera, proximity device, etc., (ii) output devices such as a printer, display, etc., and (iii) devices that communicate both as inputs and outputs, such as a modulator/demodulator (modem; for accessing another device, system, or network), a radio frequency (RF) or other transceiver, a telephonic interface, a bridge, a router, etc.

Further, using the wireless connection, the controller 115 may communicate over the network 450 to another controller 460 in another electronic device, for example, to report a faulty alarm condition. The wireless communication may occur by applying electronic short range communication (SRC) protocols. Such protocols may include local area network (LAN) protocols and/or a private area network (PAN) protocols. LAN protocols include WiFi technology, which is a technology based on the Section 802.11 standards from the Institute of Electrical and Electronics Engineers, or IEEE. PAN protocols include, for example, Bluetooth Low Energy (BTLE), which is a wireless technology standard designed and marketed by the Bluetooth Special Interest Group (SIG) for exchanging data over short distances using short-wavelength radio waves. PAN protocols also include Zigbee, a technology based on Section 802.15.4 protocols from the Institute of Electrical and Electronics Engineers (IEEE). More specifically, Zigbee represents a suite of high-level communication protocols used to create personal area networks with small, low-power digital radios for low-power low-bandwidth needs, and is best suited for small scale projects using wireless connections. Such wireless connection may include Radio-frequency identification (RFID) technology, which is another SRC technology used for communicating with an integrated chip (IC) on an RFID smartcard.

One should note that the above disclosed architecture, functionality, and/or hardware operations of the controller 115 may be implemented using software algorithms. In the software algorithms, such functionality may be represented as a module, segment, or portion of code, which comprises one or more executable instructions for implementing the specified logical function(s). It should also be noted that such modules may not necessarily be executed in any particular order and/or executed at all.

One should also note that any of the functionality of the controller 115 described herein can be embodied in any non-transitory computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" contains, stores, communicates, propagates and/or transports the program for use by or in connection with the instruction execution system, apparatus, or device.

Further, the computer readable medium in the controller 115 may include various forms of computer readable memory 405. For example the computer readable memory 405 may be integral to an apparatus or device, which may include one or more semiconductors, and in which the communication and/or storage technology may be one or more of electronic, magnetic, optical, electromagnetic or infrared. More specific examples (a non-exhaustive list) of a computer-readable medium the illustration of which being omitted for brevity include a portable computer diskette (magnetic), a random access memory (RAM) (electronic), a read-only memory (ROM) (electronic), an erasable programmable read-only memory (EPROM or Flash memory) (electronic), and a portable compact disc read-only memory (CDROM) (optical).

In addition, the above distributed system of controllers is not intended to be limiting. In one embodiment, each of the controllers on the same side of the network may be the same device such that no network there between is required. In one embodiment a single on-site controller is provided instead of the distributed system of controllers. In one embodiment the controllers on the same side of the network are controlled by servers located over the World Wide Web, using a cloud computing configuration. In one embodiment, the distributed controller network is hard-wired for all telecommunication services so that no wireless network is necessary. In one embodiment redundant wireless and wired networks are utilized which automatically switch between such services to minimize network congestion.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A network alarm system comprising:
a loop circuit, a first power source, a second power source, and a first controller electrically connected to the loop circuit, the first controller is configured to control the first power source;
a plurality of alarm units, each comprising: a current sink, a second controller that is configured to control the current sink, and each electrically connected to the loop circuit,
wherein the first controller is configured to performs a system status test, which includes being configured to:
disengage the second power source;
instruct the plurality of alarm units to actuate the corresponding plurality of current sinks;
determine a first voltage across the loop circuit;
engage the second power source and disengages the first power source;
instruct the plurality of alarm units to actuate the corresponding plurality of current sinks;
determine a second voltage across the loop circuit; and
compare the first and second voltages against a predetermined threshold to determine the operational condition of the system.

2. The system of claim 1, wherein each alarm unit comprises
a second controller that is configured to control the current sink,
wherein the second controller is configured to performs an alarm unit status test, which includes being configured to:
receive instructions from the first controller to actuate the current sink; and
actuate the current sink.

3. The system of claim 1, wherein the system status test includes the second controller being configured to:
measure the voltage across the current sink; and
send the measured voltage to the first controller.

4. The system alarm unit of claim 1, wherein each alarm unit is one or more of a smoke detector, a heat detector, a pull station, a beacon, a sounder, a flame detector, an Input/Output unit, a gas sensor, a wireless gateway, an explosion barrier, a combined smoke/heat detector, and a combined smoke/heat/carbon monoxide detector.

5. The system of claim 1, wherein the status test includes the first controller being configured to:
receive from the plurality of alarm units a corresponding plurality of measured voltages; and
determine from the plurality of measured voltages the operational condition of the system.

6. The system of claim 1, wherein to determine the operational condition of the system, the first controller is configured to includes determine one or more of:
a quality of connections of circuit cable segments;
a resistance of the circuit cable segments between the plurality of alarm units; and
a span of the circuit cable segments between the plurality of alarm units.

7. The system of claim 1, wherein the first controller is configured to periodically performs the system status test.

8. The system of claim 1, wherein the plurality of alarm units are electrically connected a second power source.

9. A method of performing a status test by a network alarm system, the network alarm system including:
a loop circuit, a first power source, a second power source, and a first controller electrically connected to the loop circuit, the first controller controlling the first power source;
a plurality of alarm units, each comprising: a current sink, a second controller for controlling the current sink, and each electrically connected to the loop circuit,
wherein the method comprises the first controller performing a system status test including:
disengaging the second power source;
instructing the plurality of alarm units to actuate the corresponding plurality of current sinks;
determining a first voltage across the loop circuit;
engaging the second power source and disengaging the first power source;
instructing the plurality of alarm units to actuate the corresponding plurality of current sinks;
determining a second voltage across the loop circuit; and
comparing the first and second voltages against a predetermined threshold to determine the operational condition of the system.

10. The method of claim 9, wherein each alarm unit includes
a second controller for controlling the current sink,
wherein the method comprises the second controller:
receiving instructions from the first controller to actuate the current sink; and
actuating the current sink.

11. The method of claim 9, wherein the system status test includes the second controller:
measuring the voltage across the current sink; and
sending the measured voltage to the first controller.

12. The method of claim 9, wherein the alarm unit is one or more of a smoke detector, a heat detector, a pull station, a beacon, a sounder, a flame detector, an Input/Output unit, a gas sensor, a wireless gateway, an explosion barrier, a combined smoke/heat detector, and a combined smoke/heat/carbon monoxide detector.

13. The method of claim 9, wherein the status test includes the first controller
receiving from the plurality of alarm units a corresponding plurality of measured voltages, and
determining from the plurality of measured voltages the operational condition of the system.

14. The method of claim 9, wherein determining the operational condition of the system includes determining one or more of:
a quality of connections of circuit cable segments,
a resistance of the circuit cable segments between the plurality of alarm units, and
a span of the circuit cable segments between the plurality of alarm units.

15. The method of claim 9, wherein the first controller periodically performs the system status test.

16. The method of claim 9, wherein the plurality of alarm units are electrically connected to a second power source.

* * * * *